United States Patent [19]
Ueda

[11] Patent Number: 5,417,408
[45] Date of Patent: May 23, 1995

[54] WAFER HOLDING APPARATUS FOR HOLDING A WAFER

[75] Inventor: Minoru Ueda, Osaka, Japan

[73] Assignee: Sumitomo Electric Industries, Ltd., Osaka, Japan

[21] Appl. No.: 130,445

[22] Filed: Oct. 1, 1993

[30] Foreign Application Priority Data

Oct. 27, 1992 [JP] Japan ............................ 4-288950

[51] Int. Cl.⁶ .............................................. B25B 11/00
[52] U.S. Cl. ...................................................... 269/21
[58] Field of Search .......................... 269/21, 903, 20; 248/362, 363; 279/3 R; 294/64 R; 51/235; 81/374, 451, 658, 925 CC

[56] References Cited

U.S. PATENT DOCUMENTS

| | | | |
|---|---|---|---|
| 4,049,484 | 9/1977 | Priest et al. | 269/21 |
| 4,093,201 | 6/1978 | Dietze et al. | 269/903 |
| 4,981,345 | 1/1991 | Berry et al. | 269/21 |

FOREIGN PATENT DOCUMENTS 433503 of 1989 European Pat. Off. .
2302897 of 1973 Germany .

OTHER PUBLICATIONS

Patent Abstracts of Japan, vo . . 7, No. 292, 27 Dec. 27, 1983 (Abstract of Japanese Patent Application 57-52403 published Oct. 4, 1983).

*Primary Examiner*—Robert C. Watson
*Attorney, Agent, or Firm*—Lane, Aitken & McCann

[57] ABSTRACT

A wafer holding apparatus for holding a wafer stationary includes a main body and a plate member detachably placed on the main body. The main body includes a cavity having an open end at the upper surface of the main body and includes a passageway extending from the cavity to communicate the cavity with a vacuum pump. The plate member is placed on the main body to plug the open end of the cavity and supports on its upper surface a wafer to be processed. The plate member has a number of through bores arranged in a predetermined arrangement matched for the arrangement of micromachined sections of the wafer where micromachines or integrated circuits are to be formed. Before processing of the wafer, the plate member is selected for the wafer in such a manner that the through bores of the plate member are deviated from the micromachined sections of the wafer where the micromachines are to be formed. This results in the micromachined sections being protected from the suction force caused by the vacuum pump, thereby making it possible to enhance the productivity of the wafer.

3 Claims, 4 Drawing Sheets

WAFER HOLDING APPARATUS FOR HOLDING A WAFER

FIELD OF THE INVENTION

This invention relates to a wafer holding apparatus for holding a wafer such as a semiconductor wafer and a silicon wafer in a work station under the influence of a suction force caused by a vacuum pump, and more particularly to a wafer holding apparatus which is adapted to hold a silicon wafer formed with a plurality of micromachines such as gears, motors, diaphragms, and cantilevers.

DESCRIPTION OF THE PRIOR ART

A semiconductor producing technology is remarkably progressed in recent years and has now come to produce ULSIs (ultra-large-scale integrated devices) with the micromachining accuracy of 1 μm which exceed LSIs (large-scale integrated devices) with the micromachining accuracy of 3 μm and VLSIs (very large-scale integrated devices) with the micromachining accuracy of 2 μm. Similarly, the research and development is recently advanced for a micromachining technology through which are formed micromachines such as gears, motors and the like in a silicon wafer by utilizing a semiconductor wafer integrated circuit producing technology.

In general, the "micromachines" have so far been employed as a technical term intended to mean micro-scale mechanical elements or structures (for example such as gears, motors, diaphragms and cantilevers) built in silicon wafers by the micromachining technology. In a narrow sense, the micromachines are generally designated as substances micro-scaled to an extent beyond physical laws. Here, the term "micromachines" appearing as the description proceeds in the present specification are, however, intended to mean microscaled mechanical elements or structures built in the silicon wafer.

During the micro;machining process, a silicon wafer forming a base material for the micromachines is required to be held stationary. For this purpose, a conventional wafer holding apparatus for producing semiconductor integrated circuits has so far been used as a silicon wafer holding apparatus.

In the conventional wafer holding apparatus, there is adopted a vacuum attracting method of utilizing vacuum pressure lower than the exterior air pressure of the wafer holding apparatus in order to hold a semiconductor wafer stationary during the process for manufacturing LSIs, VLSIs or ULSIs (hereinafter referred to simply as "LSIs"). This method is less likely to damage semiconductor wafers than a mechanical including method, and can therefore increase the productivity of the semiconductor wafer.

With reference to FIGS. 5 and 6 showing a plan view and a cross sectional view, respectively, of a prior-art wafer holding apparatus using the vacuum attracting method, a stage 1 has a number of coaxial annular grooves 2 (only one groove is illustrated) which are held in communication with a discharge port of a vacuum pump 4 through a passageway 3 provided in the stage 1.

When the vacuum pump 4 is driven, air is exhausted from the annular grooves 2 of the stage 1. Therefore, a semiconductor wafer 5 placed on the stage 1 comes to close the annular grooves 2 so that the pressure in the annular grooves is reduced, thereby resulting in a suction force corresponding to the reduced pressure and causing the semiconductor wafer 5 to be attracted to the stage 1. As a result, the semiconductor wafer 5 is reliably attracted to the stage 1 and thus held stationary on the stage 1.

When the semiconductor wafer 5 having a number of bores 6 (for example, for making micromachines 6a) is placed on the stage 1, the annular grooves 2 of the stage 1 happens to be held in communication with some of the bores 6 of the semiconductor wafer 5. Therefore, the apparatus fails to sufficiently vacuumize the annular grooves 2 and to produce a sufficient suction force required for attracting the semiconductor wafer 5 to the stage 1.

On the other hand, there are several semiconductors each of which has no such bores 6, however, having thin portions of the semiconductor wafer at micromachined sections where the micromachines are to be formed. The thin portions of the semiconductor wafer are susceptible to damages resulting from stresses imposed thereon when the semiconductor wafer undergoes a suction force produced by a vacuum pump.

From this viewpoint, the prior-art wafer holding apparatus can be employed only for use in specified semiconductor wafers each having individual arrangement of micromachines to prevent the thin portions of the semiconductor wafer 5 from being damaged by the reason stated above. In addition, the number of micromachines formed in a single semiconductor wafer is limited to a relatively low level since the semiconductor wafer is required to be placed on the stage 1 with the annular grooves being not in registry with the thin portions of the semiconductor wafer 5. As a result, the prior-art wafer holding apparatus cannot produce a wide variety of semiconductor wafers, thereby making it impossible to effectively enhance the productivity of the semiconductor wafer.

It is therefore an object of the invention to provide a wafer holding apparatus which can be used for producing a wide variety of semiconductor wafers having different arrangements of micromachines formed therein and enhance the productivity of the semiconductor wafer.

SUMMARY OF THE INVENTION

In one aspect of the present invention, a wafer holding apparatus comprises a main body provided with a cavity having an open end and formed with a passageway held in communication with the cavity; a plate member having a plurality of through bores formed therein and detachably engaging with the main body to plug the open end of the cavity, thereby forming a closed chamber, the plate member having a first surface to be held in face-to-face contact with a wafer and a second surface facing the cavity, and the through bores being so arranged in the plate member as to be closed by the portions of said wafer when the wafer is placed on the first surface of the plate member; and a vacuum pump having a discharge port held in communication with the closed chamber through the passageway to vacuumize the closed chamber through the passageway, thereby attracting the wafer on the plate member toward the vacuumized closed chamber.

According to the another aspect of the present invention, each of the through bores of the plate member is deviated from a portion of the wafer processed ;on the plate member.

In the further Aspect of the present invention, the plate member is constituted by a silicon wafer.

BRIEF DESCRIPTION OF THE DRAWINGS

The features and advantages of a wafer holding apparatus for holding a wafer in accordance with the present invention will be more clearly understood from the following description take in conjunction with the accompanying drawings in which.

DESCRIPTION OF THE PREFERRED EMBODIMENTS

Figure 1:
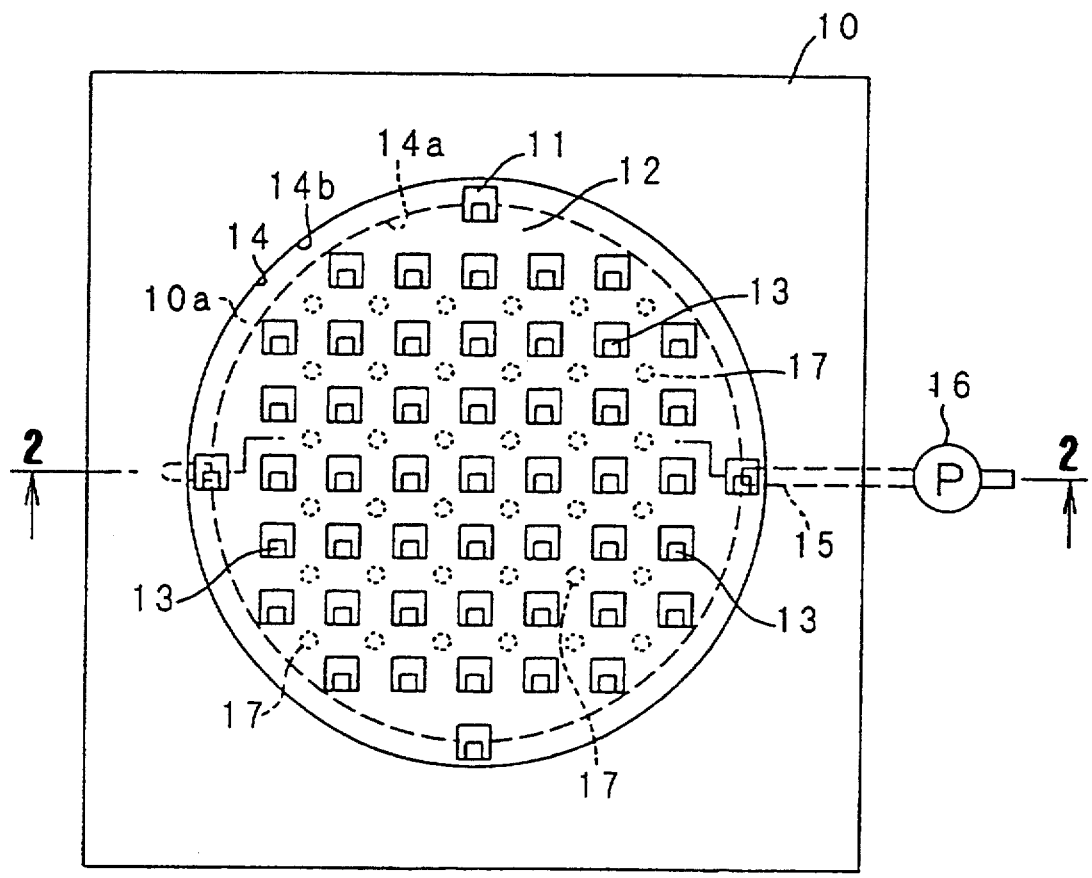
FIG. 1 is a plan view of a wafer holding apparatus embodying the present invention.
Figure 2:
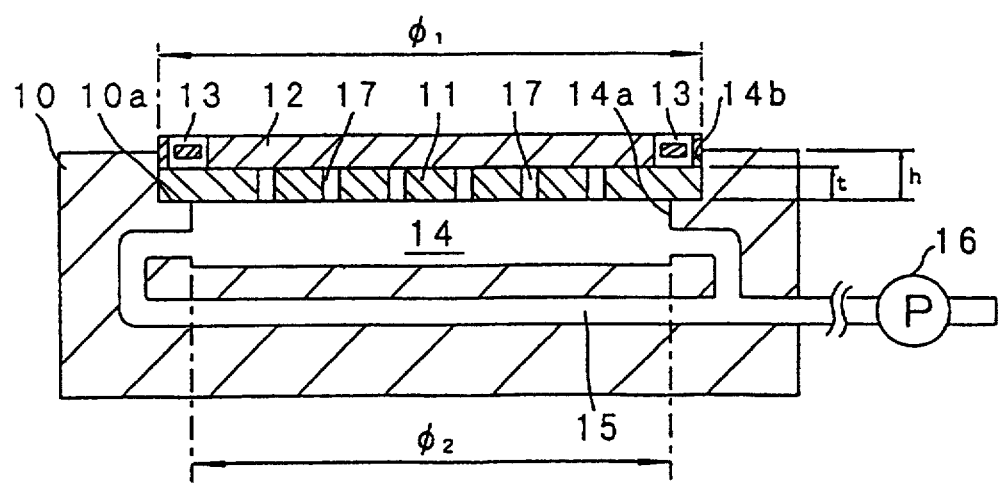
FIG. 2 is a cross sectional view taken along the line 2—2 of FIG. 1.

FIGS. 1 and 2 show a wafer holding apparatus raised as a preferred embodiment of the present invention.

In FIGS. 1 and 2, reference numeral 10 designates a main body which serves as a stage, the reference numeral 11 a plate member, and the reference numeral 12 a semiconductor wafer (typically constituted by a silicon wafer). The semiconductor wafer 12 has a number of micromachined sections 13 in which micromachines are to be formed. The micromachined sections 13 are arranged at predetermined intervals in the longitudinal and lateral directions of the semiconductor wafer 127 The micromachines formed in this embodiment are assumed as cantilevers for use in an accelerometer, however, they may of course be replaced by other kinds of micromachines.

The main body 10 is provided with a circular cavity 14 having an open end and including lower and upper coaxial cavity portions 14a and 14b different in diameter. The diameter $\phi 1$ of the upper cavity portion 14b is substantially equal to the diameter of the semiconductor wafer 12 to be processed, and the diameter $\phi 2$ of the lower cavity portion 14a is slightly smaller than the diameter $\phi 1$ of the upper cavity portion 14b. An annular flat ledge 10a is formed in the main body 10 between the lower cavity portion 14a and the upper cavity portion 14b of the cavity 14. A vacuum passageway 15 is formed in the main body 10 to extend from the side wall of the lower cavity portion 14a to the exterior of the main body 10 as illustrated in FIG. 1. A vacuum pump 16 is provided at the exterior of the main body 10 and has a discharge port held in communication with the lower cavity portion 14a of the cavity 14 through the vacuum passageway 15. The plate member 11 has a circular configuration substantially identical to that of the semiconductor wafer 12 and has a diameter also substantially equal to the inner diameter $\phi 1$ of the upper cavity portion 14b of the cavity 14. The plate member 11 detachably engages with the flat annular ledge 10a of the main body 10 to plug the open end of the cavity 14, thereby forming a closed chamber. The plate member 11 has a first surface to be held in face-to-face contact with the semiconductor wafer 12 and a second surface facing the cavity 14. When the plate member 11 is received in the upper cavity portion 14b of the cavity 14, the outer annular peripheral portion of the plate member 11 is seated on the flat annular ledge 10a of the main body 10 in the cavity 14. The thickness t of the plate member 11 is slightly smaller than the height h of the upper cavity 14b so that the upper surface of the plate member 11 terminates below the upper surface of the member 10. As a result of the thickness of the plate member 11 as well as the diameter of the semiconductor 12 as described above, the semiconductor wafer 12 is fixedly positioned in the upper cavity portion 14b of the cavity 14 without being displaced in the horizontal direction of the main body 10 under condition that the semiconductor wafer 12 is seated on the flat annular ledge 10a of the main body 10.

Figure 4:
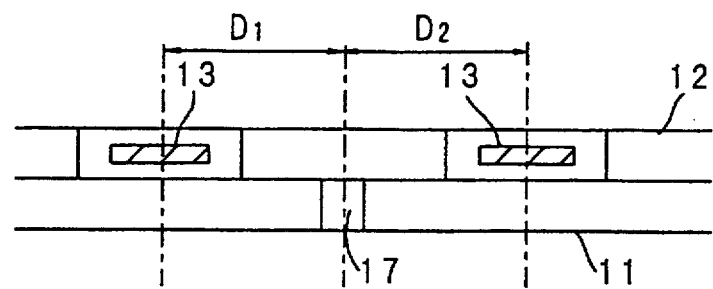
FIG. 4 is a fragmentary enlarged cross sectional view taken along the line 4—4 of FIG. 3.

The plate member 11 has a plurality of small through bores 17 formed therein and extending in the thickness direction of the plate member 11. The through bores 17 are so arranged in the plate member 11 with respect to the semiconductor wafer 12 as to be closed by the semiconductor 12 when the semiconductor 12 is placed on the first surface of the plate member 11. More specifically, the distances D1 and D2 from the center axis of the through bore 17 to the center axes of the adjacent two micromachined sections 13 are substantially equal to each other as shown in FIG. 4 so that the through bores 17 are deviated from and thus not held in coaxial alignment with the micromachined sections 13 of the semiconductor 12 on the plate member 11.

For example, as shown in FIG. 1, in case that the semiconductor wafer 12 has a number of micromachined sections 13 arranged at constant intervals of the longitudinal and lateral directions of the semiconductor 12, the plate member 11 is selected for the semiconductor wafer 12 in such a manner that each of the through bores 17 formed in the plate member 11 are equally spaced apart from the micromachined sections. 13 of the semiconductor 12 nearest to and surrounded by each of the through bores 17.

The operation of the wafer holding apparatus according to the present invention as stated above will now become apparent as the description proceeds hereinlater.

In order to place a semiconductor wafer 12 having micromachined sections 13 on a plate member 11, the plate members 11 is selected for the semiconductor wafer 12 in such a manner that each of the through bores 17 formed in the plate member 11 are equally spaced apart from the micromachined sections 13 of the semiconductor wafer 12 nearest to and surrounded by each of the through bores 17. The selected plate member 11 is then received in the upper cavity portion 14b of the cavity 14 of the main body 10 to be seated on the ledge 10a of the main body 10. Then, the semiconductor wafer 12 is placed on the selected plate member 11 and positioned with respect to the selected plate member 11 in such a manner that each of the through bores 17 in the plate member 11 are equally spaced apart from the micromachined sections 13 of the semiconductor wafer 12 nearest to and surrounded by each of the through bores 17.

Under these conditions, the pump 16 is driven to have the closed chamber of the cavity 14 vacuumized. This makes the semiconductor wafer 12 to be held in close contact with the plate member 11 with the flat annular portion of the plate member 11 being hermetically sealed with the annular ledge 10a of the plate member 11. Therefore, the pressure in the lower cavity 14a is sufficiently reduced to have all the through bores 17 of the plate member 11 completely closed by the portions of semiconductor wafer 12 surrounded by the micromachined sections 13 of the semiconductor wafer 12. As a result, the semiconductor wafer 12 and the plate member 11 are held stationary on the main body 10 while the semiconductor wafer 12 undergoes various kinds of process, such as photo lithography, inspection and evaluation.

The plate member 11 is preferably constituted by a silicon wafer which is of excellent surface smoothness and heat conductivity property. The excellent surface smoothness property of the silicon wafer results in having the plate member 11 reliably held in close contact with the semiconductor wafer 12 processed thereon. While, the excellent heat conductivity can cause the silicon wafer to be used as a heater. Therefore, such the silicon wafer 12 makes it possible to use the plate member 11 under desired conditions for special processes including anodic bonding of soda glass to the surface of the semiconductor wafer 12.

Micromachined sections 13 of the semiconductor wafer 12 are treated by an anisotropic etching process using, for example, 50% potassium hydroxide (80° C.). If a silicon wafer is used as the plate member 11, an analogous anisotropic etching is preferably applied to the through bores 17 of the plate member 11 from the viewpoint of simplicity of the micromachine manufacturing process.

Figure 3:
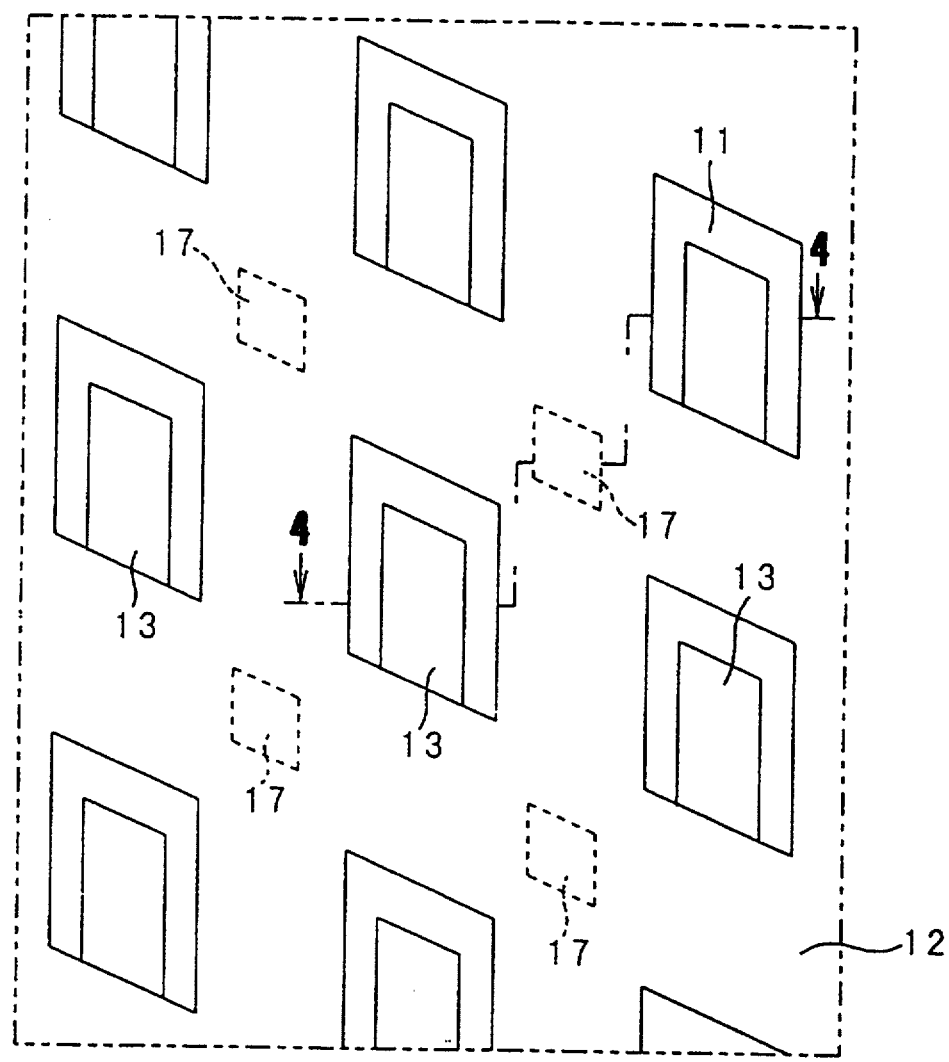
FIG. 3 is a fragmentary enlarged plan view of the wafer holding apparatus shown in FIG. 1.

When the anisotropic etching is applied to the (110) plane of the silicon wafers, the micromachined sections 13 of the semiconductor 12 and the small through bores 17 are each not configured in a rectangular shape as shown in FIG. 1, but become in a parallelogram shape as shown in FIG. 3.

Figure 5:
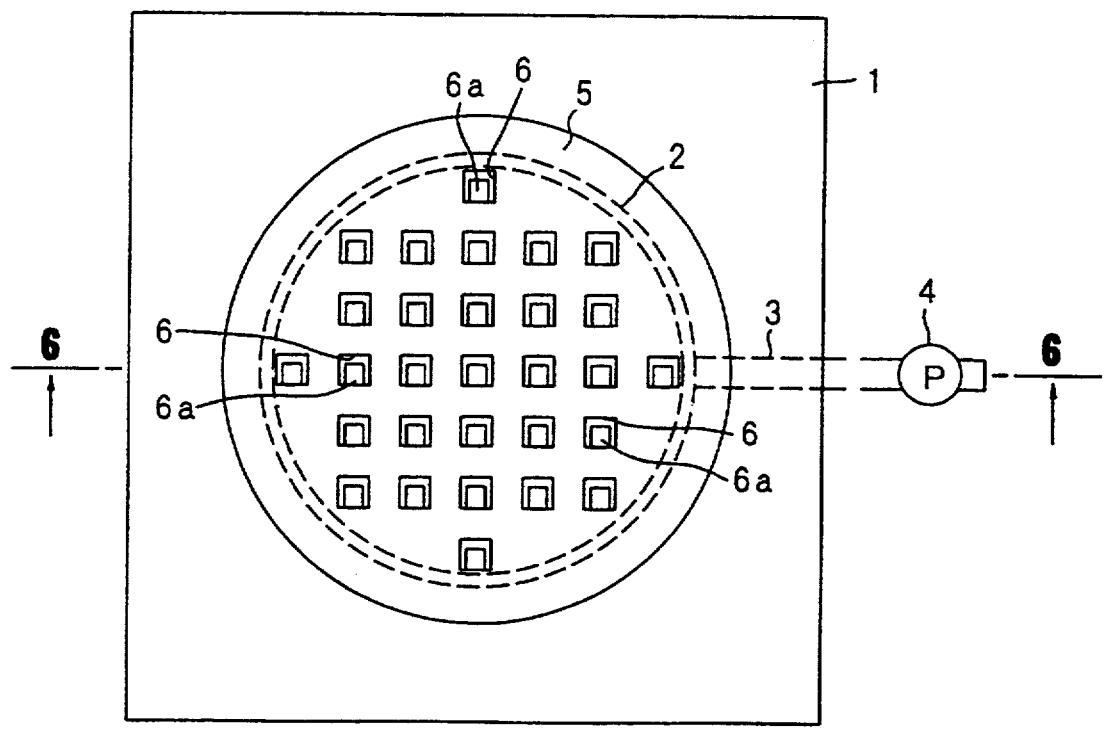
FIG. 5 is a plan view of a prior-art wafer holding apparatus.
Figure 6:
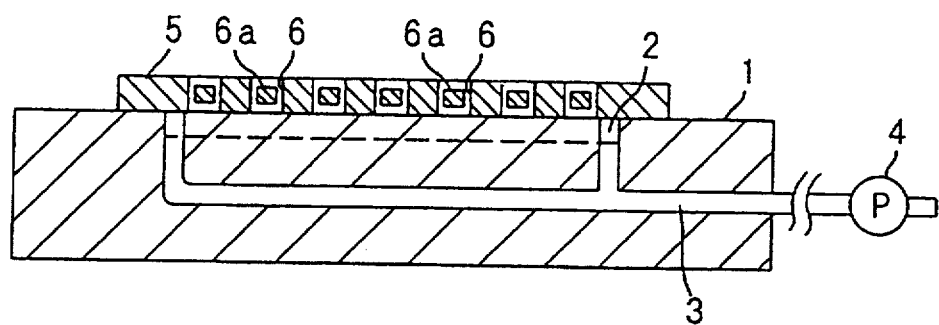
FIG. 6 is a cross sectional view taken along the line 6—6 of FIG. 5.

The semiconductor wafer 12 is illustrated in FIGS. 1 and 5 as assumed to have a completely circular contour, however, a typical semiconductor wafer has so-called orientation flat portions formed thereon. This makes it possible to simplify the positioning of the semiconductor wafer 12 with respect to the plate member 11 in the rotational direction thereof if the plate member 11 is formed with orientation flat portions on the plate member 11 so as to be engageable with the orientation flat portions of the semiconductor wafer 12. When a silicon wafer is used as the plate member 11, orientation flat portions originally formed on the silicon wafer may be used for this purpose.

The above wafer holding apparatus embodying the present invention has been described as being applied to a semiconductor wafer 12 having micromachined sections 13, however, the invention is not limited to such application to the semiconductor wafer 12. According to the present invention, the semiconductor wafer 12 may be replaced by a typical semiconductor with integrated circuits assembled therein.

As described above according to the wafer holding apparatus, the plate member 11 is detachably engaged with the main body 10 so that it is possible to select a certain plate member matched for the arrangement of the micromachined sections of the semiconductor wafer among a number of plate members having different arrangements of the through bores 17 formed therein. Therefore, the efficiency of the wafer holding apparatus can remarkably be enhanced since the semiconductor wafers 12 having different arrangements and numbers of micromachined sections 13 can be freely selected.

If a silicon wafer is used as the plate member 11, the following advantages are obtained.

(i) A plurality of plate members having different arrangements of through bores 17 to be selected in accordance with different semiconductor wafers 12 can easily be produced in a successive and batchwise manner in an anisotropic etching process.

(ii) Since the surface of the plate member 11 is of excellent smoothness like a mirror, the hermetically sealed contact between the semiconductor wafer 12 and the plate member 11 can be more reliably attained when the semiconductor wafer 12 is placed on the plate member 11, and details of the lower surface of the semiconductor wafer 12 can be observed through an image thereof appearing on the smooth surface of the plate member 11.

(iii) Since silicon is excellent in heat conductivity, the plate member 11 can be used as not only a heater but also a heat conduction means, thereby making it easier to carry out various kinds of heat processing to the semiconductor wafer 12.

(iv) Cleansing treatment and etching cleaning of the plate member 11 can be easily performed.

Although the invention has been shown and described with respect to preferred embodiments thereof, it should be understood by those skilled in the art that any modification and change may be made without departing from the spirit and scope of the invention.

What is claimed is:

1. A wafer holding apparatus comprising:
a main body provided with a cavity having an open end and formed with a passageway held in communication with said cavity;
a plate member having a plurality of through bores formed therein and detachably engaging with said main body to plug said open end of said cavity, thereby forming a closed chamber, said plate member having a first surface to be held in face-to-face contact with a wafer and a second surface facing said cavity, said wafer having active portions and other portions, said through bores being so arranged in said plate member as to be closed by the other portions of said wafer when said wafer is placed on said first surface of said plate member, and said through bores of said plate member being spaced from the active portions of said wafer; and
a vacuum pump having a discharge port held in communication with said closed chamber through said passageway to vacuumize said closed chamber through said passageway, thereby attracting said wafer on said plate member toward said vacuumized closed chamber.

2. A wafer holding apparatus as set forth in claim 1, wherein said plate member is constituted by a silicon wafer.

3. A wafer holding apparatus as set forth in claim 1, wherein the active portions of said wafer are micromachined sections of the wafer where micromachines or integrated circuits are to be formed.

* * * * *